(12) United States Patent
Partin et al.

(10) Patent No.: US 6,985,066 B2
(45) Date of Patent: Jan. 10, 2006

(54) CONTROLLED ELECTRON MOBILITY GALVANOMAGNETIC DEVICES

(75) Inventors: Dale L. Partin, Ray Township, MI (US); Joseph Pierre Heremans, Troy, MI (US); Thaddeus Schroeder, Rochester Hills, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/341,032

(22) Filed: Jan. 13, 2003

(65) Prior Publication Data

US 2004/0135665 A1 Jul. 15, 2004

(51) Int. Cl.
*H01C 7/04* (2006.01)
(52) U.S. Cl. .................................. 338/32 H; 338/32 R
(58) Field of Classification Search ............. 338/32 R, 338/32 H; 324/207.2, 207.21
See application file for complete search history.

(56) References Cited

U.S. PATENT DOCUMENTS

| 5,153,557 | A | | 10/1992 | Partin et al. ............... 338/32 R |
| 5,184,106 | A | | 2/1993 | Partin et al. ............... 338/32 R |
| 5,296,048 | A | * | 3/1994 | Chang et al. .................. 148/33 |
| 5,314,547 | A | | 5/1994 | Heremans et al. .......... 148/33.1 |
| 5,385,864 | A | | 1/1995 | Kawasaki et al. ........... 437/132 |
| 5,491,461 | A | * | 2/1996 | Partin et al. ............... 338/32 R |
| 5,883,564 | A | | 3/1999 | Partin ........................ 338/32 R |
| 6,201,466 | B1 | | 3/2001 | Schroeder ................. 338/32 R |
| 6,232,770 | B1 | | 5/2001 | Schroeder |
| 6,291,989 | B1 | | 9/2001 | Schroeder |
| 6,400,142 | B1 | | 6/2002 | Schroeder |
| 6,486,656 | B1 | | 11/2002 | Schroeder |
| 6,630,882 | B1 | | 10/2003 | Heremans et al. |

OTHER PUBLICATIONS

Roslund et al, "Si-doped and undoped $Ga_{1-x}In_xSb$ grown by molecular-beam epitaxy on GaAs substrates," J. Appl. Phys. 80 (11), pp. 6556-6558, Dec. 1, 1996.
Coderre et al, "Conduction bands of $Ga_xIn_{1-x}Sb$ Alloys," Cnaadian Journal of Physics, vol. 47, 1969 pp. 2553-2564.
Amemiya et al, "Electrical properties of InSb-based mixed crystal films," J. Appl. Phys. vol. 44 No. 4, Apr. 1973, pp. 1625-1630.
Partin et al, "Growth and characterization of indium antimonide doped with lead telluride," J. Appl. Phys. 71 (5), Mar. 1, 1992, pp. 2328-2332.

* cited by examiner

*Primary Examiner*—Karl D. Easthom
(74) *Attorney, Agent, or Firm*—Jimmy L. Funke

(57) ABSTRACT

A controlled electron mobility galvanomagnetic device comprising a layer of indium antimonide alloyed with a Group 13 isoelectronic element antimonide and doped n-type, the layer disposed on an insulating substrate.

22 Claims, 4 Drawing Sheets

CONTROLLED ELECTRON MOBILITY GALVANOMAGNETIC DEVICES

TECHNICAL FIELD

This invention pertains generally to semiconductor galvanomagnetic devices such as magneto-resistors (MRs) and Hall-effect sensors, used for magnetically sensing position, and more particularly, to controlling electron mobility in such devices in order to obtain less temperature-sensitive devices.

BACKGROUND OF THE INVENTION

Semiconductor MRs and Hall-effect devices are commonly used in the automotive industry for sensing the position of engine crankshafts and camshafts. FIG. 1 schematically depicts the layered structure of a typical semiconductor MR 10 comprising an epitaxial thin film of indium antimonide (InSb) 12 grown or otherwise deposited on a gallium arsenide (GaAs) substrate 14 and which is doped n-type with tellurium (Te) 16 during growth of the film. Other aspects of the device which are not shown and which are not unique to the present invention typically include: a pattern which is etched in the InSb epitaxial film, metal contacts, dielectric passivation, the device mounted on a permanent magnet or ferromagnetic material, wires which are bonded to the metal contacts, overmolding material, etc. These aspects are well known in the art.

Some of the relevant improvements which have been made in this art include a non-uniform n-type doping profile in the indium antimonide film (Partin et al. U.S. Pat. No. 5,184,106), a layer of indium antimonide which is heavily doped n-type near the surface to facilitate making low resistance electrical contacts (Partin et al. U.S. Pat. No. 5,153,557), adding a buffer layer of high resistivity indium aluminum antimonide between the electrically insulating substrate and the indium antimonide active layer of the device (Partin U.S. Pat. No. 5,883,564), and techniques for using a silicon substrate instead of a gallium arsenide substrate (Partin et al. U.S. Pat. No. 5,491,461). These patents generally disclose that the optimum MR device has a maximum electron mobility and hence a maximum sensitivity to a magnetic field. While these devices may be used singly, pairs of them are sometimes used to measure the differential magnetic field and hence reduce their sensitivity to temperature changes. In another development, an array of MR devices can be used to measure the magnetic field at a distribution of locations (Schroeder U.S. Pat. No. 6,201,466). Such an array can be used for facilitating sensing of the variation of magnetic field caused by a permanent magnet, electromagnet, ferromagnetic object or by eddy currents.

Other conventional semiconductor MR devices use either an InSb film, or an InSb bulk material, having similar, or no dopants. NiSb needle-like inclusions are usually incorporated into the bulk material in order to increase the device sensitivity. Some of these devices are not epitaxial, but are polycrystalline indium antimonide films on a glass or ceramic substrate. These conventional magneto-resistive sensors, which are dependent upon electron mobility, are known to have functional limitations in that they are relatively temperature-dependent, which compromises their sensing performance. FIG. 2 depicts, in graphical form, the relationship between electron mobility and temperature in indium antimonide that is doped n-type, having an average electron density at 300K of approximately $1\times10^{17}$ cm$^{-3}$. Further, most conventional InSb magnetic position sensors can only perform digital functions because of their temperature sensitivity. Therefore, there is a need for an improved InSb-based magnetic position sensor having a controlled electron mobility which is substantially temperature-independent and which can also perform both analog and digital functions. The present invention satisfies those needs, as well as others, and overcomes the deficiencies known to exist in currently available MR devices. It is also useful for making Hall-effect devices and arrays of Hall-effect devices that are temperature insensitive.

Prior publications on indium gallium antimonide epitaxial thin films, which were nominally undoped or lightly doped (below about $6\times10^{16}$ cm$^{-3}$ electron density), include:

1) J. H. Roslund et al., "Si-doped and Undoped $Ga_{1-x}In_xSb$ Grown By Molecular Beam Epitaxy on GaAs Substrates," J. Appl. Phys., Vol. 80, pp. 6556–58 (1996).
2) W. M. Coderre et al. "Conduction Bands of $Ga_{1-x}In_xSb$," Can. J. Physics, Vol. 47, pp. 2553–63 (1969).
3) Y. Amemiya, et al., "Electrical Properties of InSb-based Mixed Crystal Films," J. Appl. Phys. Vol. 44, pp. 1625–30 (1973).

In these devices, the electron mobilities vary substantially over temperature, typically more than forty percent (40%) over the temperature range from negative forty degrees Celsius to two hundred degrees Celsius (−40° C. to 200° C.).

An alternative technique, which is not part of the current invention for obtaining InSb with a small temperature coefficient of the electron mobility, is to dope with the rare earth elements erbium and samarium, as documented in the following publications:

1) D. L. Partin et al., "Samarium Doping of Molecular Beam Epitaxially Grown InSb on InP," J. Vac. Sci. Technol. Vol. 10, pp. 873–76 (1992).
2) J. Heremans et al., "Erbium Doping of Molecular Beam Epitaxially Grown InSb on InP," J. Vac. Sci. Technol., Vol. 10, pp. 659–63 (1992).

Doping indium antimonide thin films n-type with tellurium is well known in the art, and is described in the following publication:

D. L. Partin et al., "Growth and Characterization of Indium Antimonide Doped With Lead Telluride," J. Appl. Phys., Vol. 71, pp. 2328–32 (1992).

Other relevant patents directed to the state of the art of galvanomagnetic devices include:

Heremans et al. U.S. Pat. No. 5,314,547 and Kawasaki et al. U.S. Pat. No. 5,385,864.

SUMMARY OF THE INVENTION

The present invention pertains to a galvanomagnetic device, in particular an MR-based or Hall-effect-based magnetic position sensor apparatus, having controlled or stabilized electron mobility that renders the device substantially temperature-independent, as well as a method of fabricating such a device. The improved InSb-based magnetic position sensor of the present invention allows for both analog and digital applications.

The present invention comprises customizing an n-type doped alloy composition to an optimal electron density in order to drive the temperature coefficient of electron mobility to near zero. In particular, it is desired to provide an alloy composition in which the total variation in electron mobility is less than about 8% (equivalent to about ±4%) as the temperature is varied from −40° C. to +200° C. More advantageously, the variation is less than about 4% (equivalent to about ±2%). It is even more advantageous for the variation to be less than about 1% (equivalent to about ±0.5%). Making the variation in electron mobility as small as reasonably possible has the effect of making the variation in magnetic sensitivity of a galvanomagnetic device as small as reasonably possible. Thus, a device of the present invention is substantially temperature-independent when the variation in electron mobility is less than about 8%. To this end, the present invention utilizes an approach in fabrication of the resultant sensors that includes alloying an InSb epitaxial film with a Group 13 isoelectronic element, such as gallium (Ga) or aluminum (Al), and with n-type doping of the resultant alloy to a specified electron density at three hundred degrees Kelvin (300K).

The present invention offers two advantages over the alternative prior technique of doping InSb with magnetic elements such as erbium (Er) or samarium (Sm): namely, (a) most commercially available InSb sensor production equipment already maintains gallium (Ga) or aluminum (Al) or can easily add it; and (b) most commercially available InSb sensor production equipment does not typically maintain rare earth materials such as Er or Sm, and incorporation of either these elements with good control thereof would be extremely difficult, especially with respect to conventional metal organic chemical vapor deposition (MOCVD) systems.

Hall-effect devices may also be made from silicon. However, the piezoresistive coefficient of silicon is large, which leads to errors in the Hall-effect device output voltage that are typically minimized through complex circuit compensation techniques. The device of the present invention is superior because indium antimonide and its alloys have an extremely small piezoresistive coefficient, and Hall-effect devices made from them have a relatively large output voltage because of their high electron mobilities relative to silicon. This is also significant for arrays of Hall-effect devices, such as a linear array of at least several Hall-effect devices.

BRIEF DESCRIPTION OF THE DRAWINGS

The present invention will now be described, by way of example, with reference to the accompanying drawings in which.

DETAILED DESCRIPTION

Figure 1:
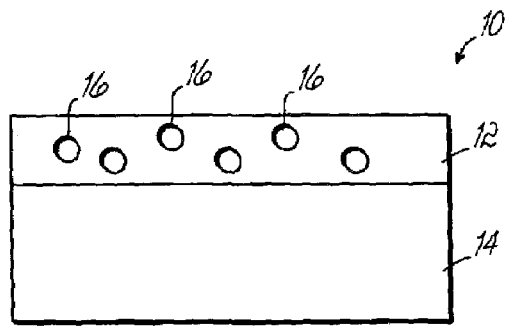
FIG. 1 is a schematic diagram in cross-section showing a typical commercially available semiconductor MR having an epitaxial thin film of InSb grown on a gallium arsenide (GaAs) substrate and doped n-type with tellurium (Te). Electrical contacts, dielectric passivation, an etched pattern in the film, etc. are well known in the art and are not shown.
Figure 2:
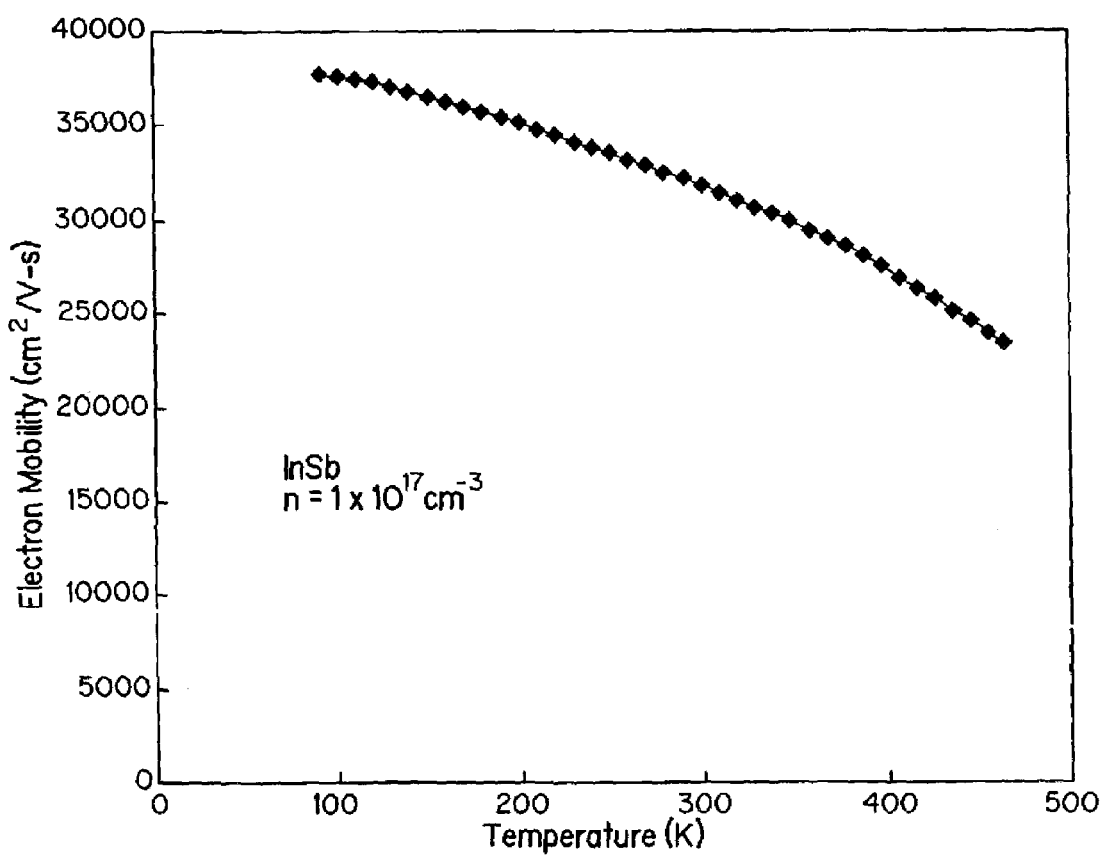
FIG. 2 is a graph depicting the relationship between electron mobility and temperature in some commercially available semiconductor MR devices.
Figure 3:
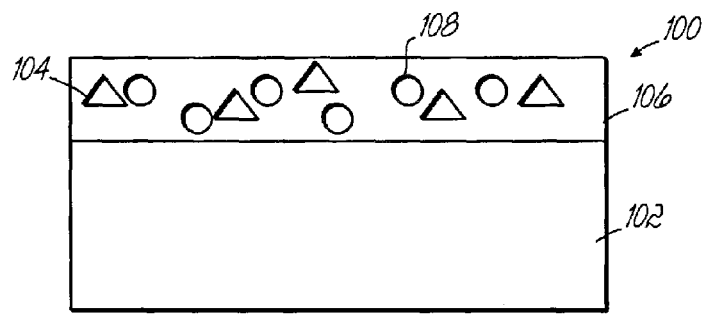
FIG. 3 is a schematic diagram in cross-section illustrating a magneto-resistive device formed according to the present invention.

Referring more specifically to the drawings, for illustrative purposes the present invention is embodied in the device generally shown in FIG. 3. It will be appreciated that the device may vary as to configuration and as to details of the parts, and that the method may vary as to the specific steps and sequence, without departing from the basic concepts as disclosed herein.

FIG. 3 illustrates a galvanomagnetic device 100 formed according to the present invention wherein an alloy layer 106 is disposed on an electrically insulating substrate 102, such as monocrystalline gallium arsenide (GaAs), silicon or a ceramic. The alloy may be deposited by any generally known technique such as molecular beam epitaxy, metal organic chemical vapor deposition, liquid phase epitaxy, etc. The alloy layer 106 comprises indium antimonide (InSb) alloyed with a Group 13 element 104 (according to the 1988 IUPAC system designations), which elements 104 include Ga, Al, B, and Tl, but excluding In. The presence of Group 13 element atoms in the alloy is schematically denoted by triangles 104. Because In is a Group 13 element, the remaining Group 13 elements are isoelectronic elements for In, meaning they have the same number of valence electrons or the same outer electronic configuration. Thus, they will substitute for In atoms in the crystal lattice but will not dope the alloy. Ga and Al are preferred isoelectronic elements 104 in the device of the present invention. From a practical standpoint, boron (B) is difficult to evaporate, and thallium (Tl) is very toxic and has low solubility in InSb, and thus while theoretically feasible, B and Tl are not preferred. The isoelectronic element 104 forms an antimonide, such that the content of the element 104 is expressed as the isoelectronic element antimonide mole fraction "x".

The alloy layer 106 is doped n-type. Doping InSb alloyed with an isoelectronic element is achieved by the same technique for doping unalloyed InSb, which is well known in the art. Examples of n-type dopants 108 include silicon (Si), tellurium (Te), selenium (Se), sulfur (S), or tin (Sn). The elements Te, Se, and S substitute for Sb atoms in the crystal lattice, but have a different chemical valence than Sb, specifically one extra valence electron, thus providing electrons to the conduction band of the semiconductor and thereby doping the material n-type. Similarly, Sn substitutes for In atoms in the crystal lattice, also doping the material n-type. Use of silicon is less preferred because it partially substitutes for In atoms and partly for Sb atoms in the crystal lattice and thus tends to be self-compensating in these alloys, making it more difficult to obtain the required electron density. Thus, Te, Se, Sn and S are always n-type dopants for InSb, whereas Si can be either an n-type or p-type dopant, depending upon crystal growth conditions and alloy composition.

In device 100, the isoelectronic element antimonide mole fraction (x) is between about 0.14–0.7, and may comprise a single Group 13 element antimonide or a mixture of Group 13 element antimonides. Thus, where A represents one or more of the Group 13 elements Ga, Al, Ti and B, the alloy layer 106 is represented by the formula $In_{1-x}A_xSb$ wherein x=0.14–0.7 and the subscript of Sb is understood in the art to be 1, implying a stoichiometric compound semiconductor alloy. Advantageously, x=0.16–0.3. Further, alloy layer 106 is doped with an n-type dopant 108 to provide an average electron density (n) at 300K of at least $8 \times 10^{16}$ cm$^{-3}$, and advantageously between $1 \times 10^{17}$ cm$^{-3}$ and $4 \times 10^{17}$ cm$^{-3}$.

Figure 4:
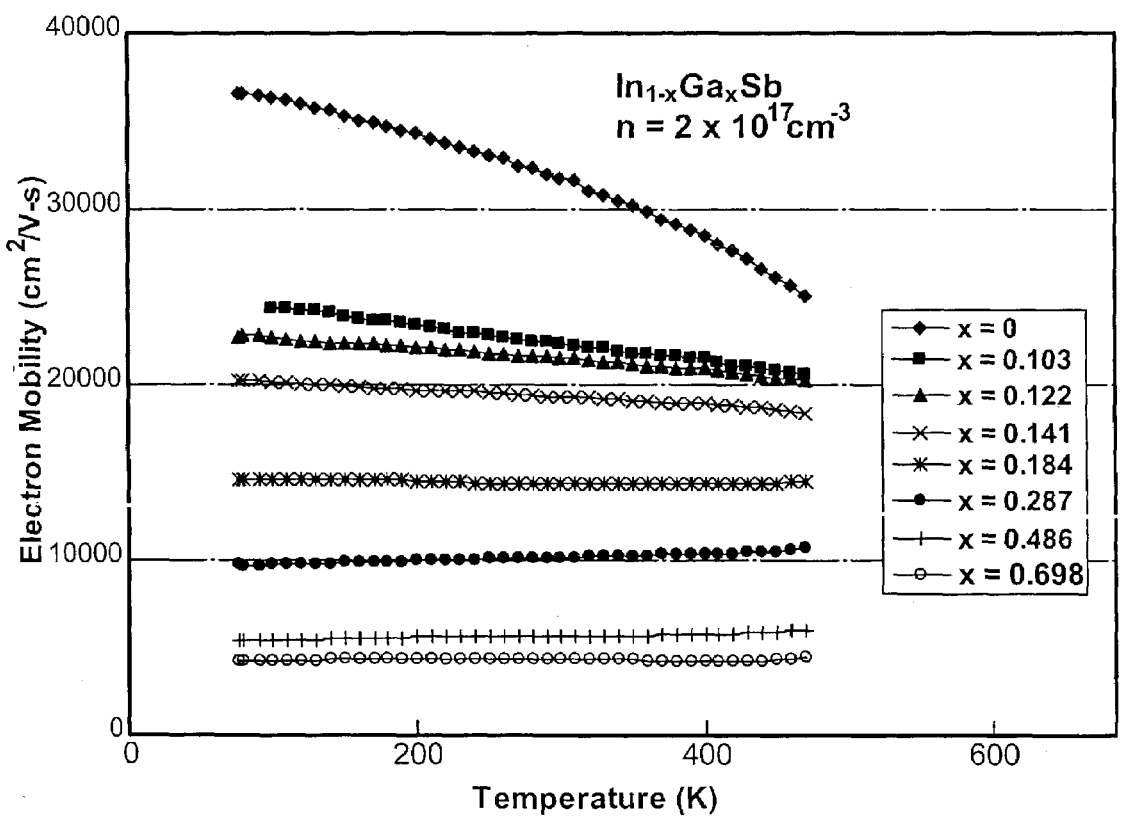
FIG. 4 is a graph depicting the relationship between electron mobility and temperature in a galvanomagnetic device fabricated according to the present invention, with an average electron density (n) at 300K of $2\times10^{17}$ $cm^{-3}$. It can be seen that the temperature coefficient of electron mobility changes sign as the gallium antimonide mole fraction (x) is increased. For gallium antimonide mole fractions less than about 0.14, the temperature coefficient of electron mobility is large and hence not controlled.
Figure 5:
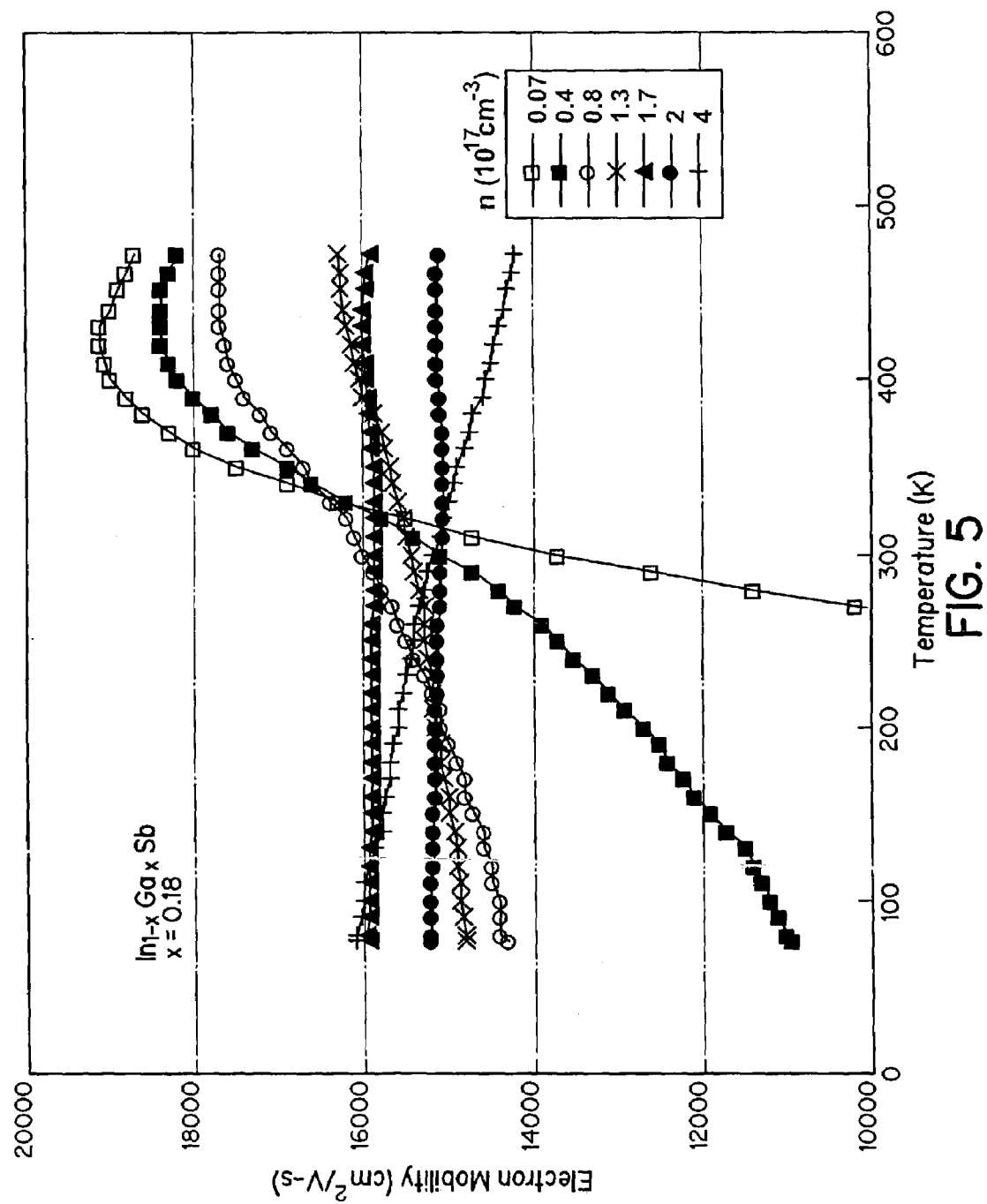
FIG. 5 is a graph depicting the relationship between electron mobility and temperature in a galvanomagnetic device fabricated from $In_{0.82}Ga_{0.18}Sb$ according to the present invention. It can be seen that the temperature coefficient of electron mobility changes sign as the average electron density (n) is increased. For average electron densities less than about $0.8\times10^{17}$ $cm^{-3}$, the temperature coefficient of electron mobility is large and hence not controlled.
Figure 6:
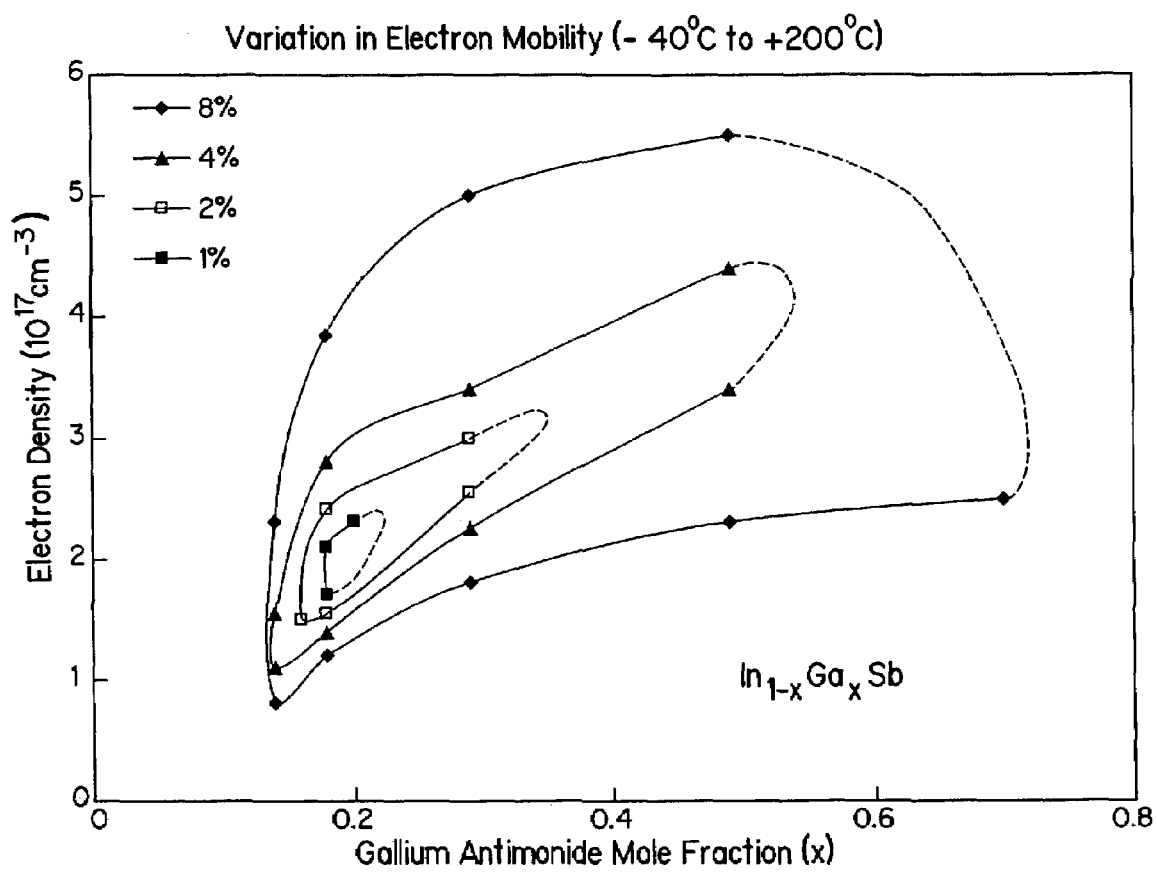
FIG. 6 is a graph depicting contours of constant total variation of electron mobility as the temperature is varied from −40° C. to +200° C., as a function of the electron density (n) and the gallium antimonide mole fraction (x) in $In_{1-x}Ga_xSb$ alloys. For a given alloy composition and electron density, this variation is determined by measuring the electron mobility over this temperature range, and then noting the percent increase from the minimum value of electron mobility to the maximum value.
Figure 7:
FIG. 7 is a sensor device of the present invention capable of both digital and analog output.

FIG. 3 will now be described with reference to an exemplary embodiment to provide further explanation, but not limitation. Indium gallium antimonide ($In_{1-x}Ga_xSb$) alloy 106 is epitaxially deposited as a thin film or layer upon an electrically insulating, single crystal gallium arsenide (GaAs) substrate 102. Here, "x" is the GaSb mole fraction in the alloy. The presence of Ga atoms in the alloy is schematically denoted by triangles 104. An n-type dopant such as tellurium (Te) 108 is also present in the alloy. In such an alloy layer 106, it is empirically found that the temperature dependencies of the influence of phonons, n-type dopant density, and gallium concentration upon the electron mobility can be used against each other in order to obtain an electron mobility that is substantially independent of temperature and hence controlled over a wide temperature range. As can be seen in FIG. 4, wherein the average electron density is constant at $n=2 \times 10^{17}$ cm$^{-3}$ and the GaSb mole fraction (x) is varied, the GaSb mole fraction is advantageously between fourteen-hundredths and seven-tenths (0.14–0.7), and more advantageously between approximately sixteen-hundredths and three tenths (0.16–0.3). From FIG. 5, wherein the GaSb mole fraction is constant at x=0.18 and the average electron density (n) is varied, the alloy layer is advantageously doped with an n-type dopant so that it has an average electron density (n) at three hundred degrees Kelvin (300K) of at least about $8 \times 10^{16}$ cm$^{-3}$. More advantageously, the average electron density (n) at three hundred degrees Kelvin (300K) is between $1 \times 10^{17}$ cm$^{-3}$ and $4 \times 10^{17}$ cm$^{-3}$. From FIG. 6, it is demonstrated that the total variations in electron mobility are less than about 8% over the operating temperature range of –40° C. to +200° C. for galvanomagnetic devices, and advantageously less than about 4%, and more advantageously less than about 1%.

In another exemplary embodiment of the present invention, aluminum (Al) can be substituted for gallium (Ga) in the above alloy. The same compositions of $In_{1-x}Al_xSb$ are used, with $0.7 \geq x \geq 0.14$, and preferably $0.3 \geq x \geq 0.16$. Furthermore, aluminum and gallium can be mixed in these alloys, so that the total Group 13 isoelectronic element antimonide mole fraction (x) is in the prescribed ranges. That is, for $In_{1-x-y}Ga_xAl_ySb$, the useful compositions are $0.7 \geq (x+y) \geq 0.14$, and preferably $0.3 \geq (x+y) \geq 0.16$. The same dopants and electron densities are used. Both gallium and aluminum are isoelectronic elements in indium antimonide in that they substitute for indium in the indium antimonide crystal lattice and have the same chemical valence as indium, therefore they do not dope the material n-type or p-type. Theoretically, boron (B) and Thallium (Tl) could also be used, but are not preferred for the practical reasons given above.

Other variations will occur to persons of ordinary skill in the art. These include depositing an n-type indium gallium antimonide film or indium aluminum antimonide film or indium gallium aluminum antimonide film onto an insulating silicon substrate or onto an insulating ceramic substrate. Another variation is to use digital alloy techniques rather than the random alloy techniques that were used here. Another variation is to use bulk alloys rather than films to make a galvanomagnetic device.

EXAMPLE

An $In_{0.8}Ga_{0.2}Sb$ alloy layer was grown epitaxially on an electrically insulating GaAs substrate using molecular beam epitaxy. The first 0.4 micrometers was not intentionally doped. The next 1.6 micrometers was doped n-type with tellurium from a PbTe dopant source at a concentration of about $2.4 \times 10^{17}$ cm$^{-3}$ during growth of the alloy layer. The last 0.05 micrometers was doped at $5 \times 10^{17}$ cm$^{-3}$ with tellurium. The average electron density at 300K (that is, averaged over the entire film thickness) was $2.1 \times 10^{17}$ cm$^{-3}$. The total film thickness was 2.05 micrometers. It was found that the total variation in the electron mobility over the temperature range from negative forty degrees Celsius to two hundred degrees Celsius (–40° C. to 200° C.) was less than about 1%, i.e., less than plus or minus one half percent (±0.5%).

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of the general inventive concept.

What is claimed is:

1. A galvanomagnetic device comprising:
    an electrically insulating substrate; and
    an alloy layer disposed on a surface of the substrate;
    wherein the alloy layer comprises indium antimonide alloyed with at least one Group 13 isoelectronic element antimonide; and
    wherein the alloy layer is doped with an n-type dopant to provide an average electron density at 300K of between $1 \times 10^{17}$ cm$^{-3}$ and $4 \times 10^{17}$ cm$^{-3}$; and
    wherein the alloy layer has a total isoelectronic element antimonide mole fraction between sixteen-hundredths and three tenths (0.16–0.3); and
    wherein the alloy layer exhibits a total variation in electron mobility of less than 2% over a temperature range of –40° C. to +200° C.

2. The device of claim 1 wherein the n-type dopant is selected from the group of elements consisting of tellurium, selenium, sulfur, and tin; and wherein the isoelectronic element (104) is selected from the group consisting of gallium, aluminum, and the combination of gallium and aluminum.

3. The device of claim 1 wherein the n-type dopant is tellurium and the isoelectronic element is gallium.

4. The device of claim 1 wherein the galvanomagnetic device is selected from the group consisting of Hall-effect sensors and magneto-resistors.

5. The device of claim 1 wherein the substrate is comprised of monocrystalline gallium arsenide and the alloy layer is epitaxial.

6. The device of claim 1 wherein the n-type dopant density and total isoelectronic antimonide mole fraction are such that the device exhibits a total variation in electron mobility of less than about 1% over a temperature range of −40° C. to +200° C.

7. The device of claim 1 wherein the device produces an analog output.

8. The device of claim 1 wherein the device produces a digital output.

9. An array of the devices of claim 1 wherein the array is used to sense a magnetic field at a distribution of locations.

10. A galvanomagnetic device comprising:
an electrically insulating substrate; and
an alloy layer disposed on a surface of the substrate comprising $In_{1-x-y}Ga_xAl_ySb$, wherein $0.3 \geq (x+y) \geq 0.16$, and
wherein the alloy layer is doped with an n-type dopant to provide an average electron density at 300K of between $1 \times 10^{17}$ cm$^{-3}$ and $4 \times 10^{17}$ cm$^{-3}$; and
wherein the alloy layer exhibits a total variation in electron mobility of less than 2% over a temperature range of −40° C. to +200° C.

11. The device of claim 10 wherein the n-type dopant is selected from the group of elements consisting of tellurium, selenium, sulfur, and tin.

12. The device of claim 10 wherein the galvanomagnetic device is selected from the group consisting of Hall-effect sensors and magneto-resistors.

13. The device of claim 10 wherein the substrate is comprised of monocrystalline gallium arsenide and the alloy layer is epitaxial.

14. The device of claim 10 wherein the n-type dopant density, x and y are such that the device exhibits a total variation in electron mobility of less than about 1% over a temperature range of −40° C. to +200° C.

15. The device of claim 10 wherein the device produces an analog output.

16. The device of claim 10 wherein the device produces a digital output.

17. A galvanomagnetic device having a controlled electron mobility for facilitating analog and digital sensing of a magnetic field, comprising an alloy of the formula $In_{1-x}A_xSb$ where A=Ga, Al, Tl or B and $0.3 \geq x \geq 0.16$, and wherein the alloy is doped with an n-type dopant to provide an average electron density at 300K of between $1 \times 10^{17}$ cm$^{-3}$ and $4 \times 10^{17}$ cm$^{-3}$; and wherein the alloy layer exhibits a total variation in electron mobility of less than 2% over a temperature range of −40° C. to +200° C.

18. The device of claim 17 wherein A is selected from the group consisting of gallium, aluminum, and a combination of gallium and aluminum.

19. The device of claim 17 wherein the n-type dopant is selected from the group of elements consisting of tellurium, selenium, sulfur, and tin.

20. The device of claim 17 wherein the galvanomagnetic device is selected from the group consisting of Hall-effect sensors and magneto-resistors.

21. The device of claim 17 wherein the device produces an analog output.

22. The device of claim 17 wherein the device produces a digital output.

* * * * *